(12) United States Patent
Bakalski et al.

(10) Patent No.: US 7,486,136 B2
(45) Date of Patent: Feb. 3, 2009

(54) POWER AMPLIFIER

(75) Inventors: Winfried Bakalski, Munich (DE); Michael Asam, Sainbach (DE); Markus Zannoth, Munich (DE); Peter Pfann, Munich (DE)

(73) Assignee: Infineon Technologies AG, Neubilberg (DE)

( * ) Notice: Subject to any disclaimer, the term of this patent is extended or adjusted under 35 U.S.C. 154(b) by 311 days.

(21) Appl. No.: 11/535,288

(22) Filed: Sep. 26, 2006

(65) Prior Publication Data

US 2008/0074735 A1 Mar. 27, 2008

(51) Int. Cl.
*H03G 3/68* (2006.01)
(52) U.S. Cl. .................. 330/124 R; 330/51; 330/295
(58) Field of Classification Search .............. 330/51, 330/53, 84, 124 R, 286, 295, 302
See application file for complete search history.

(56) References Cited

U.S. PATENT DOCUMENTS

| | | | |
|---|---|---|---|
| 6,297,696 B1 | 10/2001 | Abdollahian et al. | 330/124 |
| 6,710,650 B1 * | 3/2004 | Beaudin et al. | 330/124 R |
| 6,711,392 B1 | 3/2004 | Gillis | 455/253.2 |
| 6,806,768 B2 * | 10/2004 | Klaren et al. | 330/51 |
| 6,873,224 B2 | 3/2005 | Chominski | 333/112 |
| 2004/0183593 A1 | 9/2004 | Kwon et al. | 330/124 |
| 2004/0189380 A1 | 9/2004 | Myer et al. | 330/124 |
| 2004/0217817 A1 | 11/2004 | Huang | 330/295 |
| 2006/0119433 A1 | 6/2006 | Proehl | 330/295 |

OTHER PUBLICATIONS

Ali et al., A Wide-Band GaAs Monolithic Spiral Quadrature Hybrid and its Circuit Applications, IEEE, pp. 1394-1398, 1991.
Avitabile et al., A Compact MMIC 90° Coupler for ISM Applications, IEEE MTT-S Digest, pp. 281-284, 1997.
Isao et al., A Design of Lumped-Element 3 dB Quadrature Hybrids, Asia Pacific Microwave Conference, pp. 1141-1144, 1997.
Liang-Hung et al., Design and Implementation of Micromachined Lumped Quadrature (90°) Hybrids,IEEE MTT-S Digest, pp. 1285-1288, 2001.
Power Amlifier Architecture, RF Power Amplifiers for Wireless Communications, pp. 294-303.

* cited by examiner

*Primary Examiner*—Khanh V Nguyen
(74) *Attorney, Agent, or Firm*—Edell, Shapiro & Finnan, LLC

(57) ABSTRACT

A power amplifier has at least a first amplifier circuit with an output port and at least a second amplifier circuit with an output port. The power amplifier further has at least a coupler with a first and a second input port and a first and a second output port. The first input port of the coupler is coupled with the output port of the first amplifier circuit and the second input port of the coupler is coupled with the output port of the second amplifier circuits. The power amplifier further has a switch with at least an input terminal and at least two output terminals. The input terminal of the switch is coupled with the first output port of the coupler, wherein each of the output terminals of the switch is connected with a respective terminal impedance, the terminal impedances having different impedance values.

25 Claims, 14 Drawing Sheets

POWER AMPLIFIER

CROSS-REFERENCE TO RELATED APPLICATIONS

TECHNICAL FIELD

The present invention relates to power amplifiers.

BACKGROUND

In wireless and mobile communication applications a long stand-by and talk-time is desired. During operation of a mobile communication device the required output power of the mobile communication device depends on the distance between the device and the base station. If the distance to the base station is small the output power can be reduced to reduce power consumption and to increase the talk-time. On the other hand, a high output power is required if the distance to the next base station is long. The required output power, however, does not only depend on the distance between the mobile communication device and the base station but also on other factors such as the orientation of the device, specifically the orientation of the antenna with respect to the base station, or the obstruction of the mobile communication device by infrastructure such as buildings. The constantly varying conditions of the reception and transmission place high demands on the performance of mobile communication devices.

There has been proposed a plurality of power amplifiers which are suitable for mobile communication applications. For instance Doherty-amplifiers have been used. Other approaches use power splitters such as Wilkinson splitters to divide the input signal and to feed the split signals into small power amplifiers which can be deactivated when a small output power is desired. By-passing the power amplifier is another approach discussed for mobile communication applications.

For illustrative purposes reference is made to FIG. 14 showing a theoretical probability density distribution of the required output power for an IS-95 mobile communication system. As it becomes apparent from FIG. 14, a RF-power of about 0 dBm is required for most of the time with maximum power of up to 20 dBm required in peak situations.

A mobile communication device is designed to ensure communication in areas which are remote from the next base stations. To this end, the maximum output power of the RF-power amplifier of the mobile communication device is adapted for these extreme situations. However, the efficiency of a power amplifier significantly changes with the output power and has an optimum typically in a saturation mode. FIG. 15 illustrates a typical characteristic power curve and the efficiency dependency (power added efficiency—PAE) as a function of the input power. FIG. 15 shows that the power consumption is nonlinear with respect to the desired output power. Particularly at small power levels the efficiency is mainly determined by the quiescent current of the power amplifier which cannot be reduced further without preventing switching from a class A into a class B or class C amplifier mode. This also increases the non-linearity of the power amplifier. It is also desired to work in the so-called "back-off" range of the amplifier to ensure a linear response of the amplifier which is for instance evaluated on the basis of input amplitude to output amplitude distortion (AM/AM) or input amplitude to output phase relation (AM/PM).

SUMMARY

In one embodiment, a power amplifier may comprise at least a first amplifier circuit comprising an output port and at least a second amplifier circuit comprising an output port. The power amplifier further comprises at least a coupler comprising a first and a second input port and a first and a second output port. The first input port of the coupler is coupled with the output port of the first amplifier circuit and the second input port of the coupler is coupled with the output port of the second amplifier circuit. The power amplifier further comprises a switch comprising at least one input terminal and at least two output terminals. The input terminal of the switch is coupled with the first output port of the coupler, wherein each of the output terminals of the switch is connected with a respective terminal impedance, the terminal impedances having different impedance values.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures. Therein.

DETAILED DESCRIPTION

Figure 1:
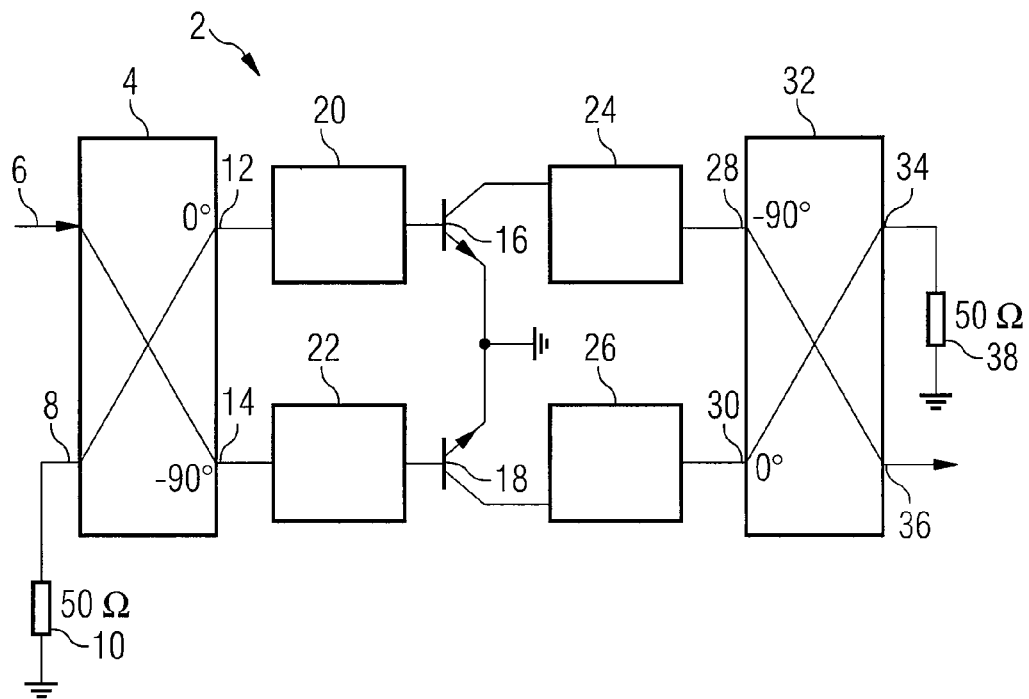
FIG. 1 shows a general arrangement of a balanced power amplifier using hybrid couplers.

In one embodiment couplers such as, for instance, hybrid couplers may provide a plurality of advantages such as providing impedances which are matched to terminated ports of the power amplifier. The efficiency dependency of the power amplifiers can be reduced since the couplers allow a portion of the power reflected by an output of the power amplifier to be consumed at least partially by the terminal impedance. This may prevent the reflected output power from being transmitted to the amplifier circuits.

In one embodiment a power amplifier circuit may comprise at least a first amplifier circuit, which comprises an input port, and at least a second amplifier circuit comprising an input port. The power amplifier circuit further may comprise at least a coupler comprising a first and a second input port and a first and a second output port. The first output port of the coupler can be coupled with the input port of the first amplifier circuit, wherein the second output port of the coupler can be coupled with the input port of the second amplifier circuit, and the first input port of the coupler can be coupled with an input port of the power amplifier. The power amplifier further may comprise a switch comprising at least one output terminal and at least two input terminals, wherein the output terminal of the switch can be coupled with the second input port of the coupler, and each of the input terminals of the switch can be connected with a separate terminal impedance having a different impedance value.

In one embodiment a power amplifier can be provided comprising a first amplifying means for amplifying a signal and a second amplifying means for amplifying a signal. The power amplifier further may comprise a coupling means comprising a first and a second output port for combining the signals amplified by the first and second amplifying means at the second output port of the coupling means. A switching means can be coupled to the first output port of the coupling means for selectively coupling the first output port of the coupling means with separate terminal impedances.

In one embodiment a method for operating a power amplifier can be provided comprising the steps of:
splitting an input signal to provide at least two split signals;
amplifying each of the split signals by at least two amplifier circuits;
combining the amplified split signals by a coupler at an output port of the coupler, wherein another output port of the coupler is coupled with a nominal terminal impedance; and
reducing the output power of the power amplifier by the following steps:
deactivating one of the two amplifier circuits;
disconnecting the nominal terminal impedance from the another output port of the coupler; and
connecting a non-nominal terminal impedance having an impedance value being different from the impedance value of the nominal terminal resistance with the another output port of the coupler.

Reference will now be made in detail to various embodiments, examples of which are illustrated in the drawings. In the Figures and the description that follows, like reference numerals refer to similar elements. The examples are provided by way of explanation, and are not meant as a limitation of the invention. For example, features illustrated or described as part of one embodiment can be used on or in conjunction with other embodiments to yield yet a further embodiment. It is intended that the present invention encompasses such modifications and variations.

The invention will be described in connection with a balanced power amplifier comprising a first or signal splitting coupler and a second or signal combining coupler. The invention should not, however, construed to be restricted to the particular embodiments shown. The switching of the terminal impedance as described below can be applied either to the first or the second coupler or to both. Further, the impedance or resistor values of nominal and non-nominal impedances may have values which differ from the values given in the embodiments. Furthermore, the couplers of the embodiments are 90° hybrid couplers. However, the invention is not restricted to the particular couplers used in the embodiments. The invention is also not restricted to mobile communication applications. Instead, the invention can be applied to any application where different power modes of an amplifier are desired, such as e.g. wireless communication applications.

FIG. 1 illustrates a general arrangement of a balanced amplifier in accordance with an embodiment. The balanced amplifier 2 comprises a first coupler 4 comprising a first input port 6 and a second input port 8. The first input port 6 of the first coupler 4 defines an input of the balanced amplifier 2. The second input port 8 of the coupler 4 is terminated with a nominal terminal resistor or impedance 10 which can be realised for instance by a 50 Ohm resistor. The terminal impedance is however not restricted to 50 Ohm. Other nominal terminal impedances are conceivable and depend on the actual design of the balanced power amplifier. For instance, in 100 Ohm systems the nominal terminal impedance is 100 Ohm.

The coupler 4 further comprises a first and second output port 12 and 14 which are connected with a first and a second amplifier circuit 16 and 18 through optional matching networks 20 and 22. The first and second amplifier circuits 16, 18 are represented here as single bipolar transistors. However, the invention is not restricted thereto. Amplifier circuits may comprise other active single amplifier devices such as bipolar transistors (BJT (Bipolar Junction Transistor) or HBTs (Heterojunction Bipolar Transistor)) or FETs such as HEMTs (High Electron Mobility Transistor), MOS-Transistors (Metal Oxide Semiconductor Transistor) or MESFETs (Metal Semiconductor Field Effect Transistors) on silicon semiconductor or III-V semiconductor (such as GaAs) basis or operational amplifiers or may comprise circuits which are formed by more than one active and passive device. BJTs are formed in silicon semiconductor substrates while HBTs are formed in SiGe/SiGeC and III-V semiconductor materials such as InP and GaAs. As it will become more apparent in the remainder of the description, first and second amplifier circuits 16 and 18 may also be formed by balanced power amplifiers, cascaded power amplifiers or amplifiers comprising two or more amplifiers stages. The first and second amplifier circuits 16 and 18 preferably have the same configuration such that a symmetrical and therefore a balanced power amplifier is formed. Further optional matching networks 24 and 26 are connected with the respective outputs of the amplifier circuits 16, 18 to couple the amplifier circuits 16, 18 with a first and a second input port 28, 30 of a second coupler 32. A first output port 34 of the second coupler 32 is terminated with a terminal resistor or impedance 38 which can be a nominal terminal resistor of 50 Ohm. As described more in detail below, the first output 34 of the second coupler 32 can be selectively connected with separate terminal impedances during operation of the balanced amplifier. Output port 36 of the second coupler 32 provides an amplified signal, and is coupled with a load such as an antenna (not shown).

The first and second couplers 4 and 32 are preferably 90° hybrid couplers which allow, depending on the termination of their ports, to divide or to combine signals. For instance, the second input port 8 of the first coupler 4 is terminated with suitable terminal impedance such as a nominal terminal impedance of about 50 Ohm. The input signal fed into the first input port 6 of the first coupler 4 is divided, and a portion of the signal appears at the first output port 12 and the remaining portion at the second output port 14. As indicated in FIG. 1, the signal at the second output port 14 will have a phase that is shifted of about −90° with respect to the signal at the first output port 12. If the amplifier circuits 16 and 18 are properly matched, no signal power will appear at the second input port 8 of the first coupler 4, hence, the power of the input signal presented to the coupler at the first input port 6 is split by the coupler 4 and transferred to the first and second amplifier circuits 16 and 18.

On the other hand, if the first output port 12 is terminated by a suitable terminal impedance such as a nominal terminal impedance of for instance 50 Ohm as is the case for the second coupler 32, the power of input signals fed into the second coupler 32 at its first and second input ports 28 and 30 will be combined by the second coupler 32 and appear as a combined signal at the second output port 36 which is for instance coupled with an antenna. The first coupler 4 shifts the signal fed into the second amplifier circuit 18 by about −90° with respect to the signal fed into the first amplifier circuit 16. The second coupler 32 also provides a phase shift with respect to the input signals such that the input signal fed into the first input port 28 is phase shifted of about −90° with respect to the signal fed into the second input port 30 so that the signals fed into the first and second input port 28 and 30, respectively, do not exhibit a phase shift with respect to each other. The signals are therefore combined "in phase" at the second output port 36 of the second coupler 32. The phase shifting properties of hybrid couplers allows designing balanced amplifiers. Therefore, hybrid couplers with 90° phase shift between the signals at the output ports are preferred. An example of such a hybrid coupler is a branch line coupler. Other examples are Lange couplers or phase hybrid circuits designed by lumped elements as described later.

Ideally, no power appears at the first output port 34 of the second coupler. However, this partially depends on the impedance of the load coupled to the second output port 36. If the impedance of the load is not matched to the output impedance of the second output port 36 a portion of the power transmitted by the second output port 36 will be reflected by the load and would then transmitted back to the amplifier circuits 16 and 18. Antennas coupled to the second output port 36 have for instance a varying load since their orientation with respect to a base station and the surrounding infrastructure such as buildings influences the emission characteristic of the antenna and hence its input impedance.

Figure 2:
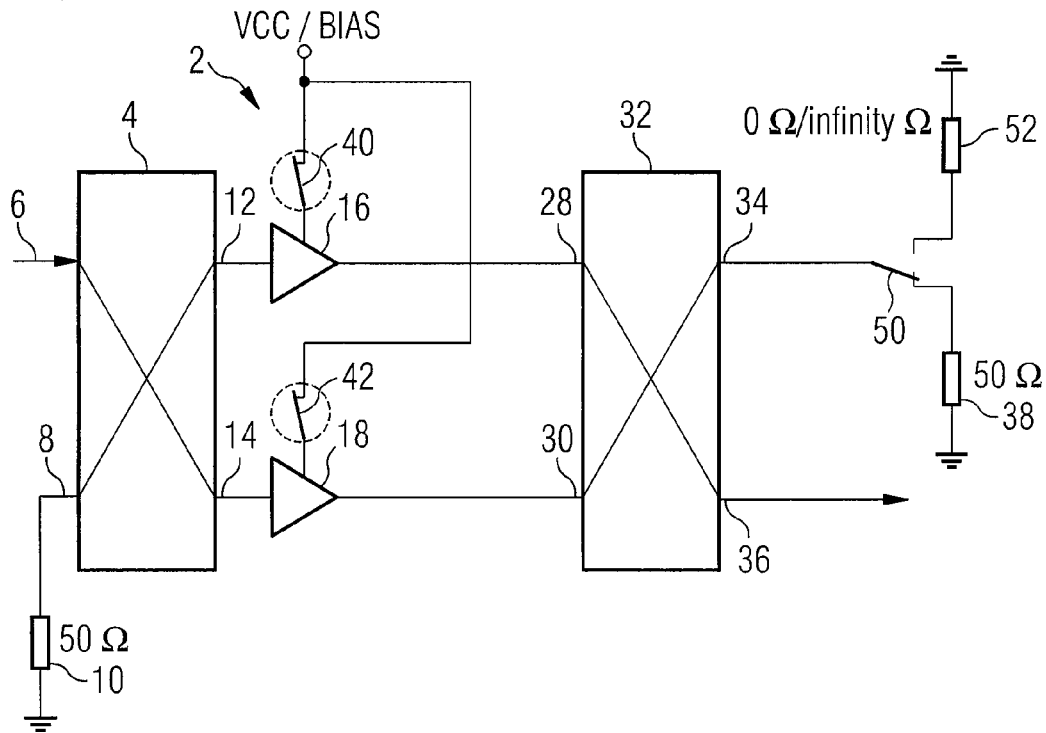
FIG. 2 shows a more detailed arrangement of a balanced power amplifier operating in a "high power mode" according to an embodiment.

Referring now to FIGS. 2 and 3 a balanced power amplifier is described in accordance with an embodiment. To avoid repetition, like reference numerals have been assigned to like parts. As shown in FIG. 2, the amplifier circuits 16 and 18 can be selectively activated and deactivated by amplifier control switches 40 and 42 which switch either $V_{CC}$ or the bias voltage applied to the power amplifiers 16 and 18. By deactivating one of the amplifier circuits the output power of the balanced power amplifier 2 can be reduced of about half of the output power or approx. about 3 dB, respectively.

Reducing the output power of the balanced power amplifier by deactivating one of the amplifier circuits may lead to a re-matching of the terminal impedance connected to the first output port 34 of the second coupler 32. To this end, a switch 50 (or a second switch) is connected with its input terminal to the first output port 34 of the second coupler 34. The (second) switch 50 allows a selective connection of the first output port 34 with either the nominal terminal impedance 38 or with non-nominal terminal impedance 52. Connecting the first output port 34 of the second coupler 32 with the non-nominal terminal impedance 52 causes a deactivation of one of the signal paths. A signal path comprises one of the amplifier circuits. For example, when the first amplifier circuit 16 is deactivated, the first output port 34 of the second coupler 32 is connected with small terminal impedance. On the other hand, when the second power amplifier 18 is deactivated, the first output port 34 of the second coupler 32 is connected with high terminal impedance.

Figure 8:
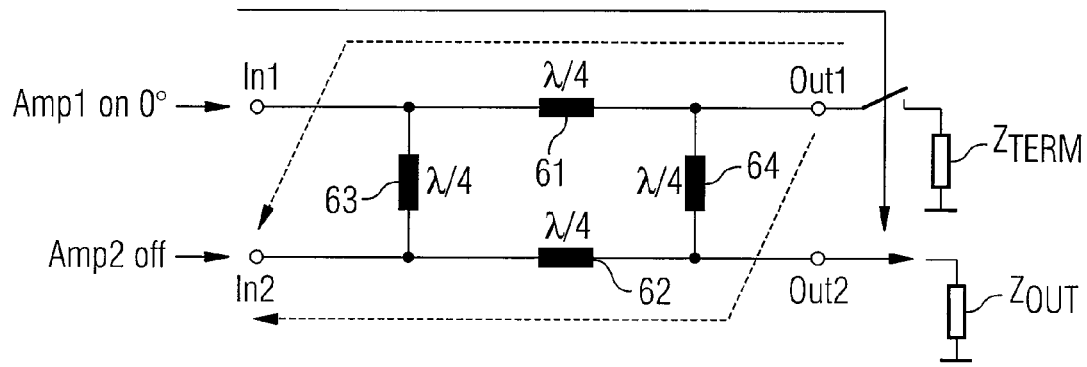
FIG. 8 shows the transmitted and reflected signals by the coupler when only the first amplifier circuit is activated.
Figure 9:
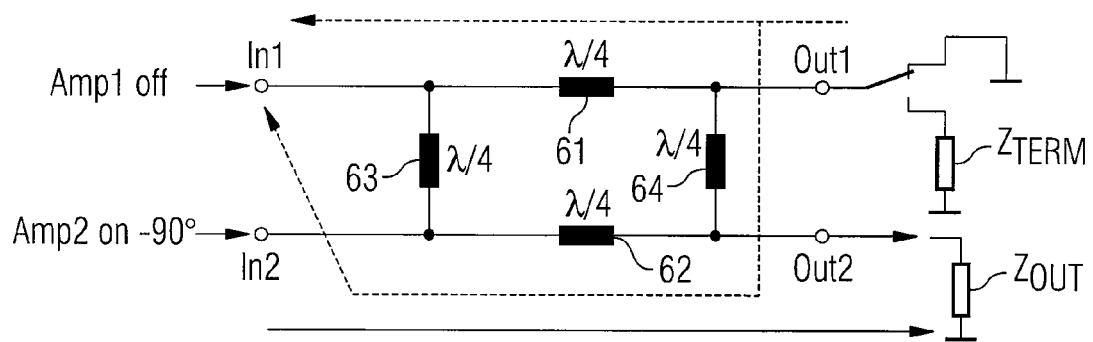
FIG. 9 shows the transmitted and reflected signals by the coupler when only the second amplifier circuit is activated.

The effect of connecting either small or high non-nominal terminal impedance 52 with the first output port 34 is illustrated in more detail in FIGS. 8 and 9. High or small terminal impedance is to be understood relative to the nominal terminal impedance 38. Ideally, the small terminal impedance would be 0 Ohm, i.e. the first output port 34 is directly connected to ground. On the other hand, the high terminal impedance is preferably infinity, i.e. the first output port 34 would be connected with impedance having an infinitely high value. In practical applications, however, the actual value of non-nominal terminal impedance 52 is formed by the impedance of, for instance, a MOSFET transistor and its channel together with the impedance of connection lines and metallizations. For instance, when the MOSFET is switched on (MOSFET channel conducts source with drain), a small impedance value of about 5 Ohm or less or even 1 Ohm or less can be obtained. On the other hand, if the MOSFET is switched off (source and drain are isolated by MOSFET channel) high impedance value of about 1 kOhm or higher can be obtained. For many applications these values are sufficient for providing suitable impedance matching. In addition to an ohmic part the channel of the MOSFET may also provide a capacitive part which will be in particular pronounced when the MOSFET is switched off. The capacitive part is formed by the substrate capacity between the channel and the substrate. Hence, the non-nominal impedance 52 generally has a complex value.

In FIG. 2, the situation of a "high power mode" is shown with both amplifier circuits 16 and 18 being activated and the first output port 34 of the second coupler 32 being connected with the nominal terminal impedance 38 of about 50 Ohm. Symmetrically thereto, the second input port 8 of the first coupler 4 is also connected with nominal terminal impedance 10 which is also about 50 Ohm.

Figure 3A:
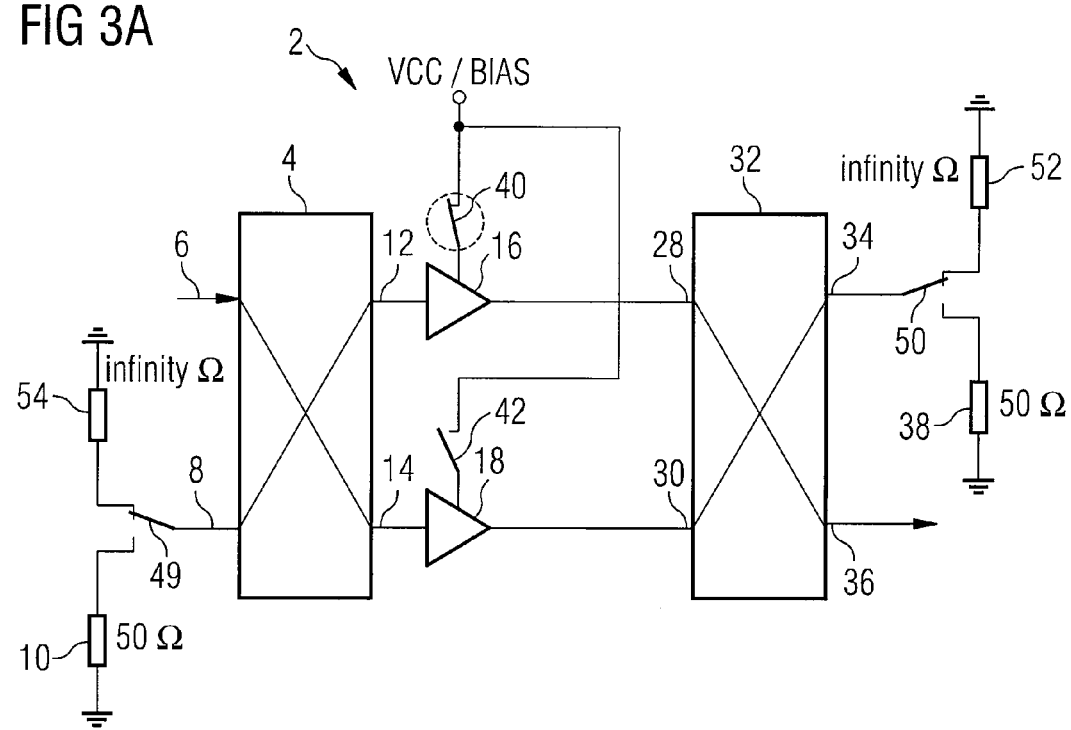
FIGS. 3a and 3b show the balanced power amplifier operating in a "low power mode" in accordance with an embodiment.
Figure 3B:
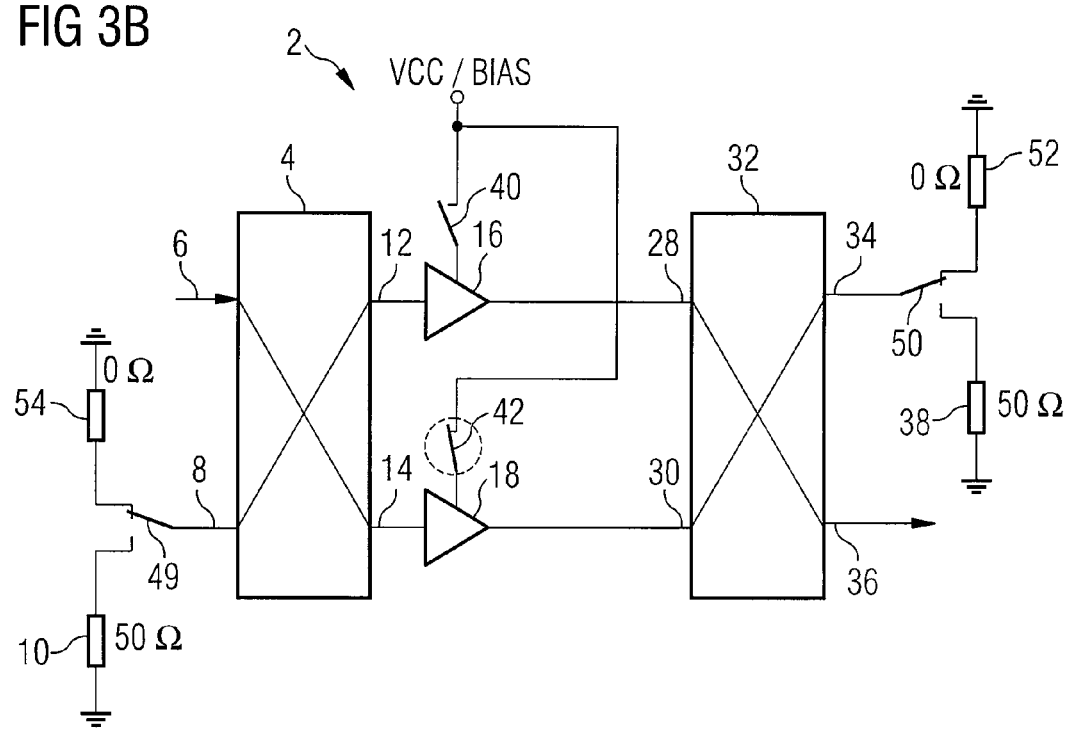

A "low power mode" is shown in FIG. 3a. In this situation the second amplifier circuit 18 is deactivated by disconnecting the $V_{CC}$ or the bias voltage through amplifier control switch 42. The switched on amplifier control switches are circled in FIG. 3a. Deactivation of the second amplifier circuit 18 may lead to a re-matching of couplers 4 and 32. Therefore, the first output port 34 of the second coupler 32 and the second input port 8 of the first coupler 4 are preferably each connected with high value impedances 52, 54 through first and second switches 49 and 50, respectively. For re-matching it would be sufficient to connect the first output port 34 of the second coupler 32 with the high value non-nominal impedance 52 and to keep the nominal terminal impedance 10 of 50 Ohm connected with the second input terminal 8 of the first coupler 4. When only switch 50 is operated, i.e. only first output port 34 of the second coupler 32 is connected with high impedance 52 while second input port 8 of the first coupler 4 remains connected with nominal terminal impedance 10, the maximum power is reduced by about 3 dB. However, the gain is also reduced by about 3 dB since the first coupler simply acts as an attenuator due to the deactivation of the second amplifier circuit 18. The saturation power ($P_{SAT}$) is reduced in this situation by about only 3 dB as it becomes apparent from FIGS. 15 to 18 described later. A symmetrical re-matching as shown in FIGS. 3a and 3b provides on the other hand an overall gain reduction of only 3 dB while maintaining a very high efficiency. This has been confirmed by a simulation of the balanced power amplifier of FIGS. 2 and 3. The simulation results will be later described in connection with FIGS. 16 to 18.

Another "low power mode" is shown in FIG. 3b. In this mode, the first amplifier circuit 16 is deactivated while keeping the second amplifier circuit 18 active. Deactivation of the first amplifier circuit 16 is effected by switching off amplifier control switch 40 while keeping amplifier control switch 42 switched on. For symmetrical re-matching the second input port 8 of the first coupler 4 and the first output port 34 of the second coupler 32 are each terminated with respective low value impedances 52, 54 of about 5 Ohm or less.

The first and second amplifier circuits 16 and 18 can be alternatively deactivated to bring the power amplifier into a "low power mode". Depending on which amplifier circuit 16 or 18 is deactivated, re-matching with either low or high value impedance is performed. In general, when deactivating the first amplifier circuit 16 low value impedances are coupled with first output port 34 of second coupler and, preferably, also with second input port 8 of first coupler 4. On the other hand, when the second amplifier circuit 18 is deactivated, high value impedances are coupled with first output port 34 of second coupler 32 and, preferably, also with second input port 8 of first coupler 4.

In many applications the switch 50 is used for switching between nominal terminal impedance 38 and the either high or low non-nominal value impedance 52, respectively. Since a balanced power amplifier typically comprises identical amplifier circuits 16 and 18, it is sufficient to deactivate for instance only the second amplifier circuit 18 to bring the balanced power amplifier into a "low power" mode. In this case, the output terminals of the switch 50 are connected with the nominal impedance 38 and the non-nominal high value impedance 52 to connect selectively the couplers with the nominal impedance 38 or high value non-nominal impedance 52. Alternatively, the first amplifier circuit 16 could always be deactivated. Here, the output terminals of the switch 50 are connected with the nominal impedance 38 and low value non-nominal impedance 52 to switch selectively therebetween. It is, however, also conceivable to deactivate any of the amplifier circuits 16 and 18. In this case, the switch 50 is arranged to allow connection with one of the nominal, high value and low value impedance. For this purpose, the switch 50, or a switching unit, may comprise three output terminals.

An advantage of the balance power amplifier as described above is that it can operate substantially independent of the load and enables a switching between at least two different power modes. Further, the balanced power amplifier has a high efficiency in each mode so that even in a "low power" modus a linear amplification with high efficiency can be obtained.

Figure 7:
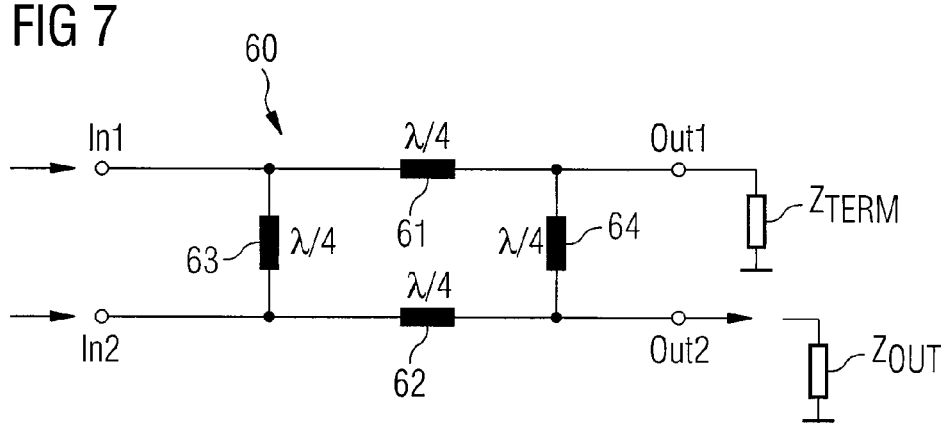
FIG. 7 shows the arrangement of a coupler in accordance with an embodiment.

The effect of switching between separate terminal impedances having different impedance values will be next described in connection with FIGS. 7 to 11. FIG. 7 shows a branch line coupler 60 which is preferably used as coupler 4 and 32, respectively. The branch line coupler 60 comprises two parallel transmission lines 61, 62 having a length corresponding to a quarter of a wavelength λ. Transmission lines 61, 62 are coupled by quarter wavelength lines 63 and 64, respectively. The length of the respective transmission lines are designed for a given working frequency to which the wavelength λ corresponds. The branch line coupler 60 has two input ports In1, In2 and two output ports Out1, Out2 which correspond to the respective input and output ports of the couplers 4 and 32 shown in FIGS. 2, 3a and 3b. The branch line couplers shown in FIGS. 7 to 11 operate as power combining couplers. Therefore, output port Out1 of branch line coupler 60 is terminated by nominal terminal impedance $Z_{TERM}$.

When using a 90° hybrid coupler, for instance branch line coupler 60, as a power combiner in a balanced power amplifier as is the case for the second coupler 32, the first output port Out1 of the coupler is terminated by nominal impedance $Z_{TERM}$ which is typically a 50 Ohm resistor. The second output port Out2 is coupled to a load which can be, for instance, an antenna. In FIGS. 7 to 11 first and second output ports are designated as Out1 and Out 2, respectively. Further, first and second input ports of the couplers are designated by In1 and In2, respectively. First and second input ports In1, In2 are coupled with respective first and second amplifier circuits which are represented in FIGS. 8 to 11 by Amp1 and Amp2, respectively. When both amplifiers are active and connected with the coupler the output signals of the amplifiers are combined at second output port Out2. The signal paths through the coupler are illustrated for this case in FIG. 11. Therein, the solid lines show the signal paths to the second output port Out2 while the dash-dotted lines show the signal paths to the first output port Out1. The signals of first and second power amplifiers are shifted by about −90° with respect to each other due to the action of the first coupler 4 (FIG. 1). When the signal of each amplifier is transmitted through the coupler each quarter wavelength transmission line 61, 62, 63, 64 retards the signal by about λ/4 or −90°, respectively.

For instance, the signal of the second amplifier is fed into the second input port In2 with a phase of −90°. The signal is further retarded by −90° by transmission line 62 so that the signal at the second output port Out2 will have a phase of about −180°. On the other hand, the signal of the first amplifier fed into the first input port In1 is not phase shifted. However, since the signal of the first amplifier passes quarter wavelength line 63 and transmission line 62 (or transmission lines 61 and 64) an overall phase shift of −180° is added to the signal of the first amplifier at the second output port Out2. Therefore, both signals have a phase of −180° at second output port and are therefore "in phase" and combined at second output port Out2.

On the other hand, the signals of the first and second amplifier circuits which are combined at the first output port Out1 are out of phase with respect to each other by about 180° and therefore cancel each other. A complete cancellation is obtained when both signals have the same strength. Therefore, preferably identical amplifier circuits are used and the first coupler 4 should symmetrically splits the input signal between the first and second amplifier circuit. Hence, the split signals are combined at second output port Out2 while no power is transmitted to first output port Out1.

Figure 10:
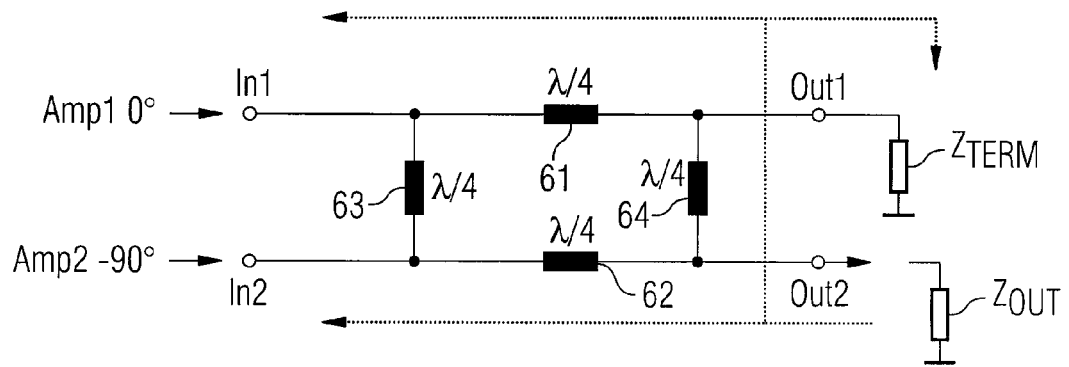
FIG. 10 shows the reflected signal by the hybrid coupler when the first and the second amplifier circuits are activated.
Figure 11:
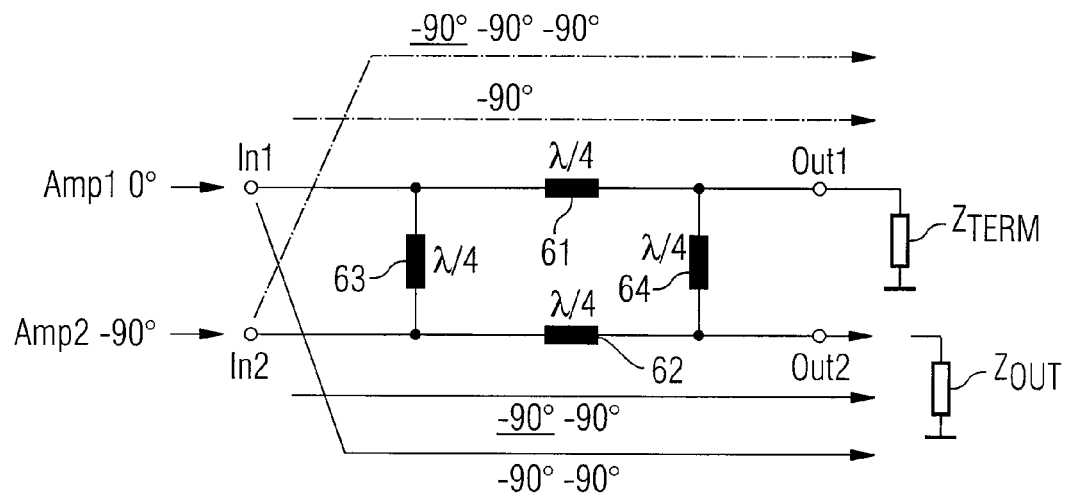
FIG. 11 shows the phase correlation of the transmitted signals.

Another advantage of a 90° hybrid coupler is illustrated in FIG. 10. About half of the power, which is reflected by the load indicated by $Z_{OUT}$ and coupled to the second output port Out2, is transmitted to the impedance $Z_{TERM}$ and dissipated there so that only a portion of the reflected power is transmitted to the first and second input port In1 and In2. The flow of the reflected power is in FIG. 10 indicated by dotted lines.

The operation of a 90° hybrid coupler explained above in connection with the branch line coupler 60 is typical for a symmetrical operation of the first and second amplifier circuit, i.e. when both amplifier circuits are active. When only one amplifier circuit is active no signal cancellation occurs at the first output port Out1. Therefore, about half of the power of the signal fed into the coupler is dissipated by $Z_{TERM}$ which results in a substantial reduction of the output signal power. Consequently, only about half of the signal is transmitted to the second output port Out2 and, consequently, to the load. To avoid this, the first output port Out1 is coupled to non-nominal impedances of a high or low value depending on which amplifier circuit is deactivated.

FIG. 8 illustrates the situation when the second amplifier circuit Amp2 is deactivated ("off") and only the first amplifier Amp1 is active ("on"). In this mode, the first output port Out1 of the coupler 60 is connected with high value impedance. This is illustrated in FIG. 8 by simply disconnecting the nominal impedance $Z_{TERM}$ so that first output port Out 1 is open. Electrically equivalent thereto is a coupling with high value impedance which is grounded. As it becomes evident from FIG. 8, the open circuit (disconnected first output port Out1) is transformed by the coupler 60 to an open second input port In2; hence the input impedance of the second input port In2 becomes high. In this situation, the coupler 60 simply acts as a 90° phase shifter with respect to the first input port In1.

Alternatively, the first amplifier circuit can be deactivated (Amp1 is "off"). In this case, the first output port Out1 is connected with low value impedance which is illustrated in FIG. 9 by connecting the first output port Out1 with a ground terminal. Electrically equivalent thereto is a coupling with low value impedance which is grounded. The closed circuit of first output port Out1 is transformed to an open circuit at first input port In1; hence the input impedance at first input port In1 becomes high. The short circuit therefore does not influence the operation of the coupler 60 and the signal is transmitted to the second output port Out2. Preferably, low value impedance should have a value as small as possible since a very small impedance is transformed to a very high input impedance at first input port In1. In many applications, connecting the first output port Out1 with a resistor of 5 Ohm or less is sufficient. The signal path is indicated in FIGS. 9 and 10 by solid lines whereas the transformation of the first output port Out1 is indicated by dashed lines.

It is worth noting that in the above described situations the output of the respective disconnected amplifier circuits is assumed to have high impedance. If, on the other hand, the output of the disconnected amplifier circuits becomes short circuit, "on" and "off" of the amplifiers needs to be exchanged.

Due to the transformation of the coupler 60 when its first output port Out1 is connected either with low or high value impedance the load might also be transformed to appear at different value at the respective input port of the coupler 60. This could lead to a mismatch particularly in low power modes of the balance power amplifier. To ensure linearity of the balance power amplifier, the balance power amplifier should be operated only in its linear region with sufficient offset to the compression region (non-linear region). Alternatively, additional matching networks could be used as it becomes more apparent from the embodiment shown in FIGS. 4 and 5.

To reduce any unwanted reduction in gain and efficiency, the signal splitting or input coupler of the balanced power amplifier should be symmetrically terminated with respect to the power combining or second coupler.

Figure 4:
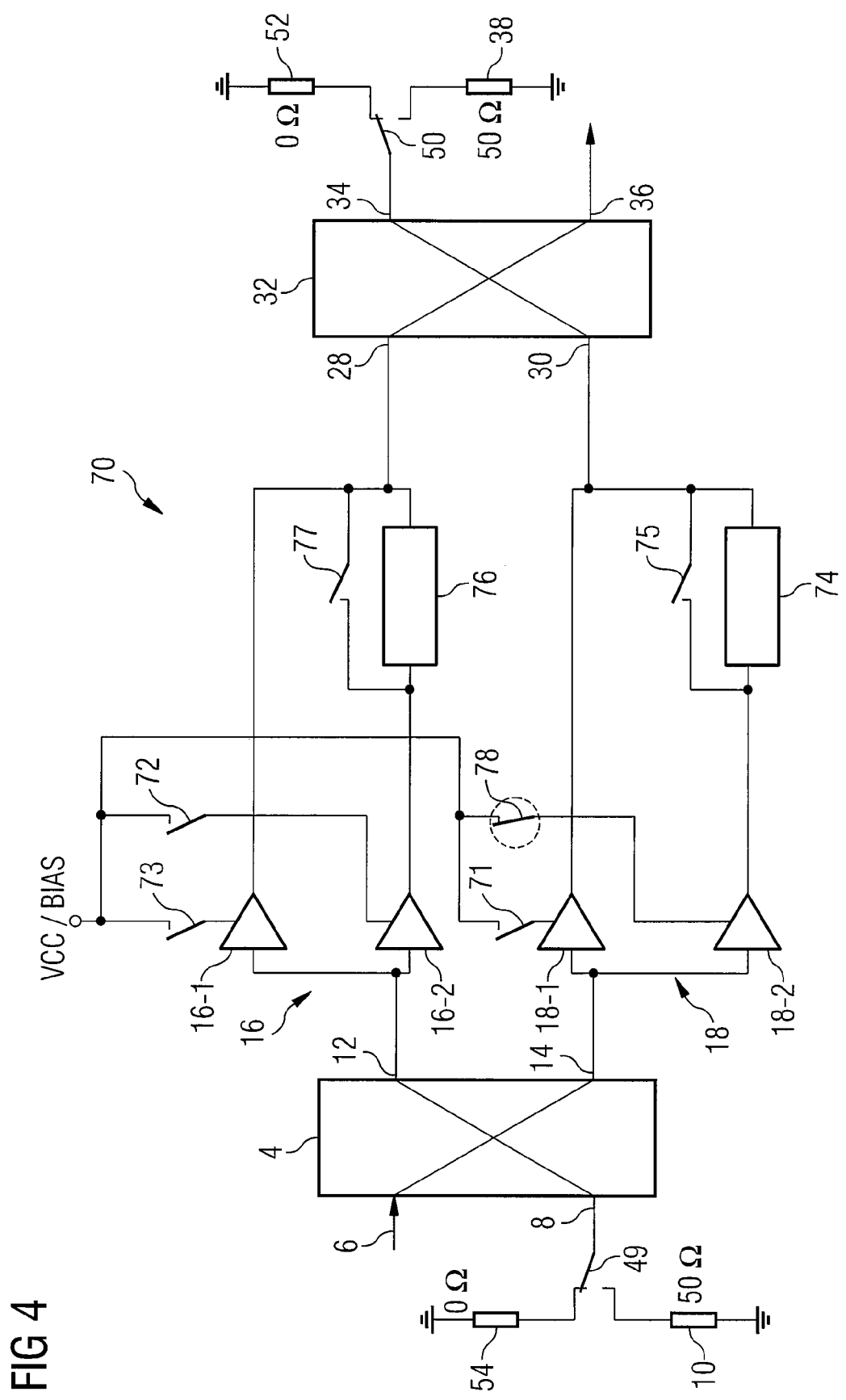
FIG. 4 shows a balanced power amplifier operating in a "low power mode" according to an embodiment comprising two main and two auxiliary amplifier circuits.
Figure 5:
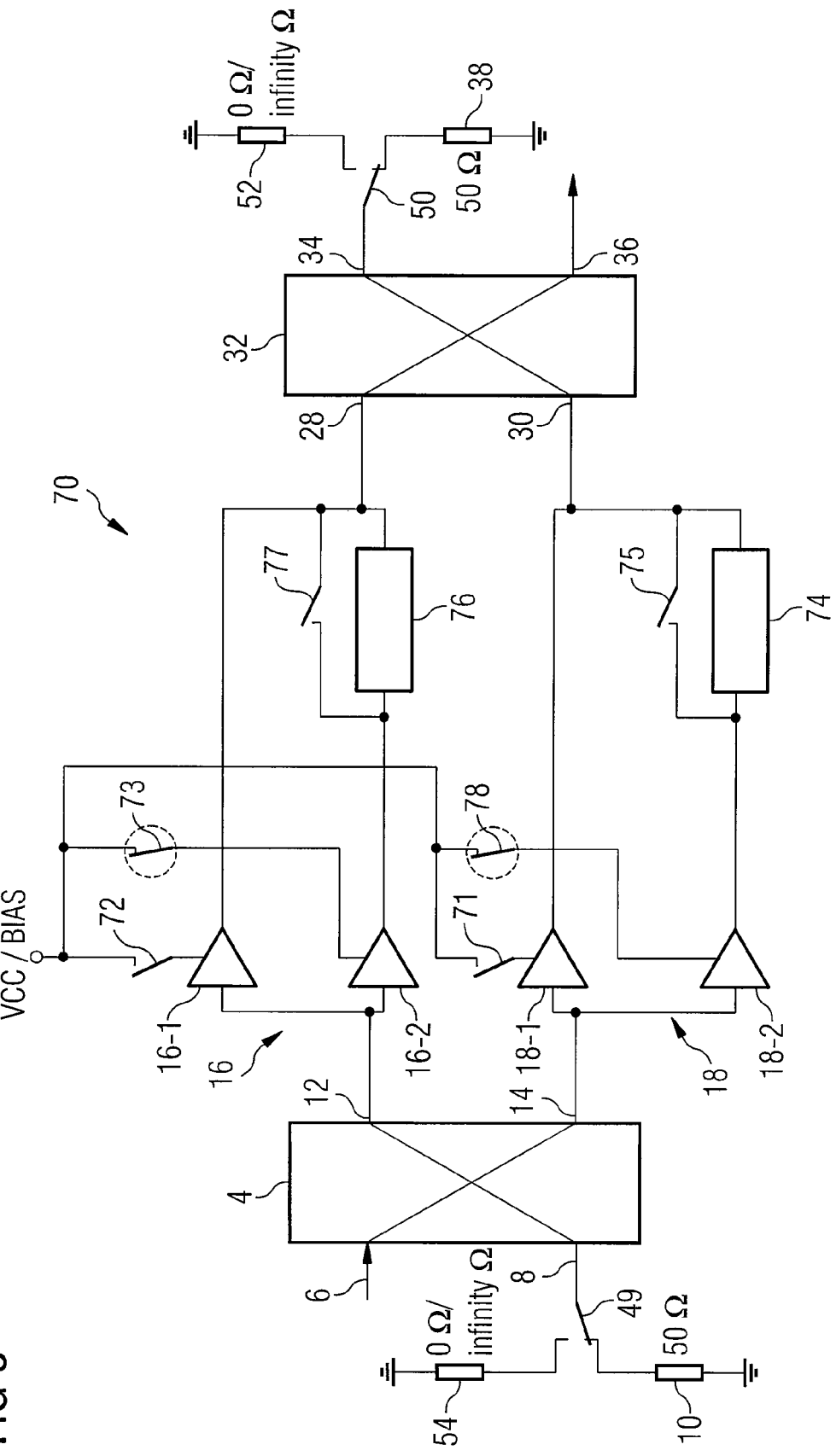
FIG. 5 shows the power amplifier of FIG. 4 operating in a "medium power mode".

In connection with FIGS. 4 and 5 a balanced power amplifier 70 according to a further embodiment is shown. Each of the amplifier circuits 16 and 18 comprises a main and an auxiliary amplifier 16-1, 16-2, 18-1 and 18-2, respectively. The auxiliary amplifiers 16-2 and 18-2 are low power amplifiers. The balanced power amplifier 70 provides three modes in comparison with the balanced power amplifier 2 shown in FIGS. 2, 3a and 3b which provides only two modes.

In the "low power mode" shown in FIG. 4 of the balanced power amplifier 70 only auxiliary amplifier 18-2 is activated by switching on amplifier control switch 78. Amplifier control switches 71, 72 and 73 remain open (switched off). Since only auxiliary amplifier 18-2 of the second amplifier circuit 18 is active, a matching network 74 is connected to the output of the auxiliary amplifier 18-2 to provide an appropriate matching between the second amplifier circuit 18 and the second coupler 32. Matching network 74 can be short circuited by switch 75 when the main and the auxiliary amplifier 18-1 and 18-2 are active. A corresponding circuit is provided for the first amplifier circuit 16 comprising matching network 76 and switch 77 for short circuiting the matching network 76. Since only second amplifier circuit 18 is active by driving auxiliary amplifier 18-2 while all other amplifiers (16-1, 16-2, 18-1) are deactivated the balanced power amplifier is in an "unbalanced" mode and therefore a termination with non-nominal impedances is desired. Therefore, corresponding to the situation of FIG. 3b the second input port 8 of the first coupler 4 and the first output port 34 of the second coupler 32 are each short circuited or terminated with a low value impedance or resistor.

A "medium power mode" is illustrated in FIG. 5 by activating the auxiliary amplifier 16-2 and 18-2 of amplifier circuits 16 and 18, respectively. In this state, matching networks 74 and 76 remain active and switches 75 and 77 are open. The closed switches are illustrated by circles. In the "medium power modus" only low power or auxiliary amplifiers 16-2 and 18-2 are active. Since the first and the second amplifier circuits 16 and 18 operate symmetrical in the "medium power modus", coupler 4 is terminated at its second input port 8 with nominal terminal impedance 10. Similar, second coupler 32 is terminated at its first output port 34 with nominal terminal impedance 38.

In a "high power mode" which is not illustrated, all amplifier control switches 71, 72, 73 and 78 are closed to activate main and auxiliary amplifiers 16-1, 18-1, 16-2 and 18-2 of the first and second amplifier circuits 16 and 18. In this mode matching networks 74 and 76 are short circuited by switches 75 and 77, respectively. Nominal terminal impedances 10 and 38 are connected with the respective ports 8 and 34 of the first and the second coupler through first and second switches 49 and 50, respectively.

By using the amplifier arrangement shown in FIGS. 4 and 5 a power reduction of the balanced power amplifier can be obtained by first deactivating the high power or main amplifiers 16-1 and 18-1. In this stage the balanced power amplifier 70 would still operate independently of the load since both couplers 4, 32 are symmetrically terminated with nominal impedances. For instance, a power reduction down to 16 dBm (UMTS low power mode) would be achievable by deactivating the main amplifiers 16-1 and 18-1. This corresponds to the above described "medium power mode" illustrated in FIG. 5. A further reduction (down to about 0 dBm) would be possible by further deactivating either auxiliary amplifier 16-2 or 18-2 ("low power mode"). Thereby, the quiescent current of the balanced power amplifier is further reduced by about 50%.

Figure 6:
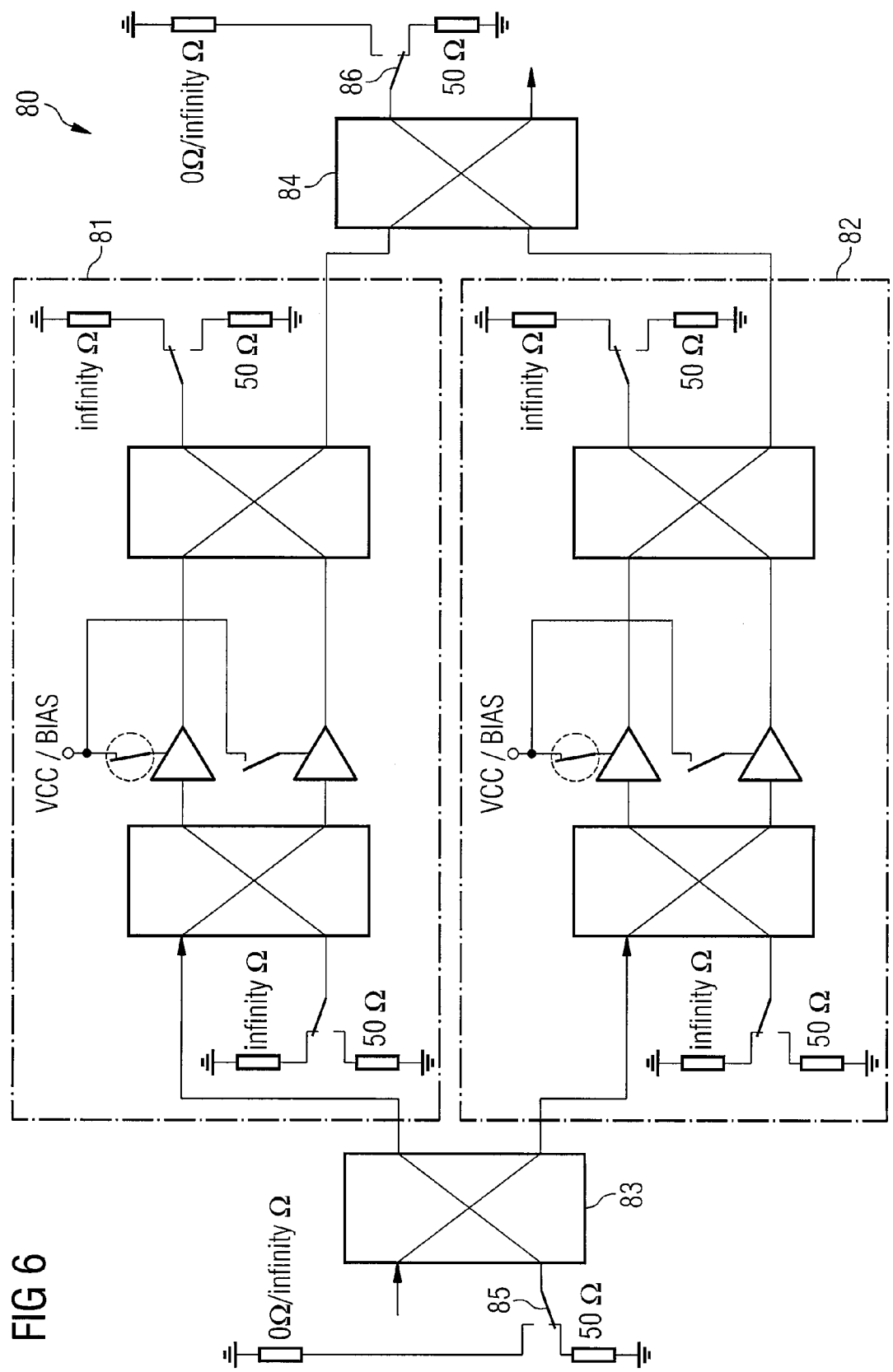
FIG. 6 shows a balanced power amplifier according to an embodiment comprising four amplifier circuits.

FIG. 6 shows a four-stage balanced power amplifier 80 according to further embodiment. The four-stage balanced power amplifier 80 comprising two coupled balanced power amplifiers shown in FIGS. 2, 3a and 3b each of which forming a branch or an amplifier circuit of the four-stage balanced power amplifier 80. Hence, two balanced power amplifiers as described in connection with FIGS. 2, 3a and 3b now each form a first and a second amplifier circuit 81 and 82, respectively. In other words, two balanced power amplifiers each comprising two amplifier circuits are combined by an input and an output coupler 83 and 84, respectively. The second input port of the first coupler 83 and the first output port of the second coupler 84 can be selectively coupled with either a nominal terminal impedance or with a non-nominal terminal impedance through first and second switches 85 and 86, respectively. The four-stage balanced power amplifier 80 therefore comprises four different power modes depending on the number of activated amplifiers of the respective first and second amplifier circuits 81 and 82.

It is also possible to combine more than 4 amplifier circuits by cascading the structure of the balanced power amplifier shown in FIGS. 2 and 6. Generally, $2^n$ identical power amplifier circuits can be coupled by $2*2^n-2$ couplers using the basic structure shown in FIGS. 2 and 6, wherein n is a natural number greater or equal 1.

Figure 12:
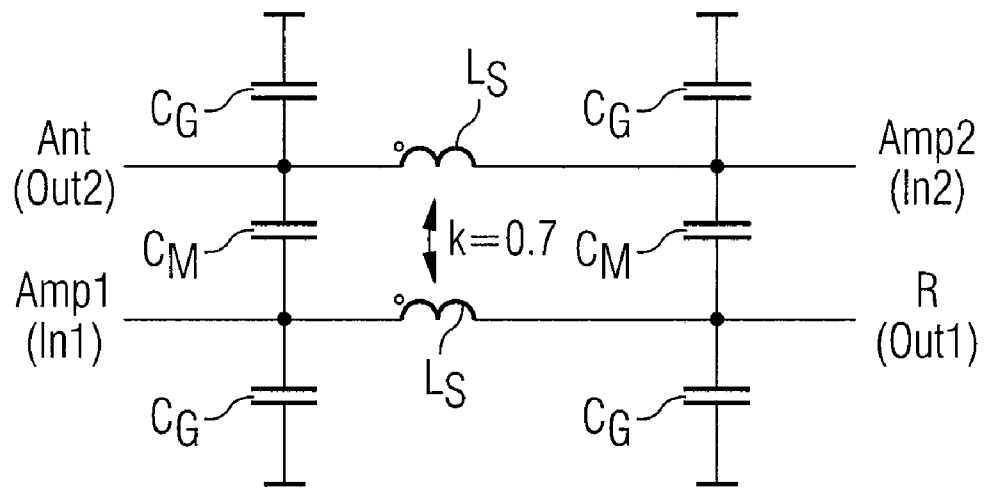
FIG. 12 shows a hybrid coupler designed by lumped elements in accordance with an embodiment.
Figure 13:
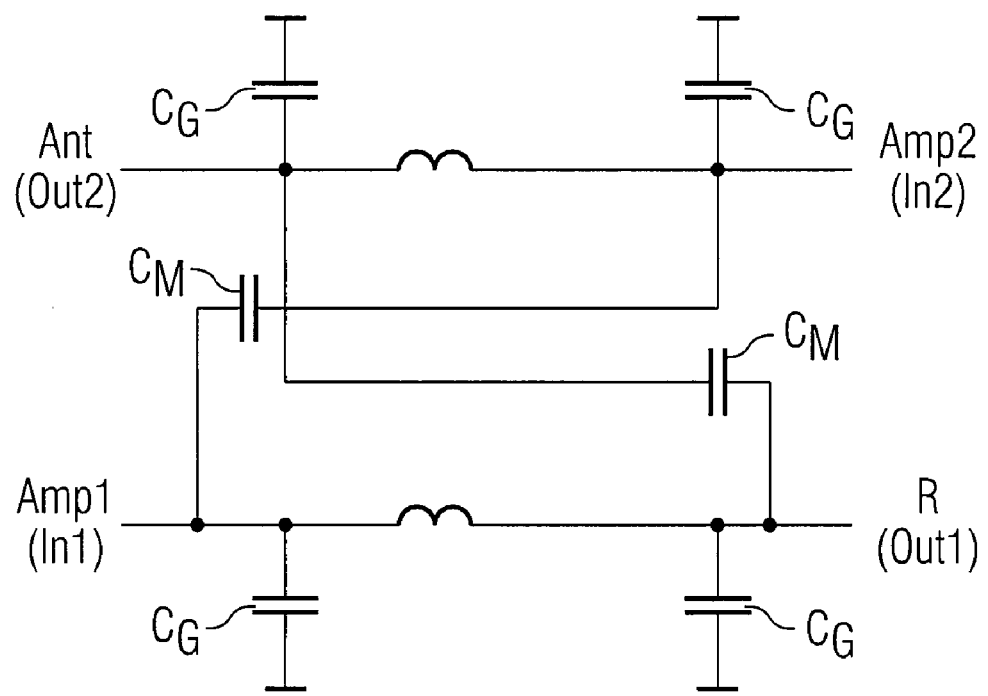
FIG. 13 shows a hybrid coupler designed by lumped elements in accordance with an embodiment.
Figure 14:
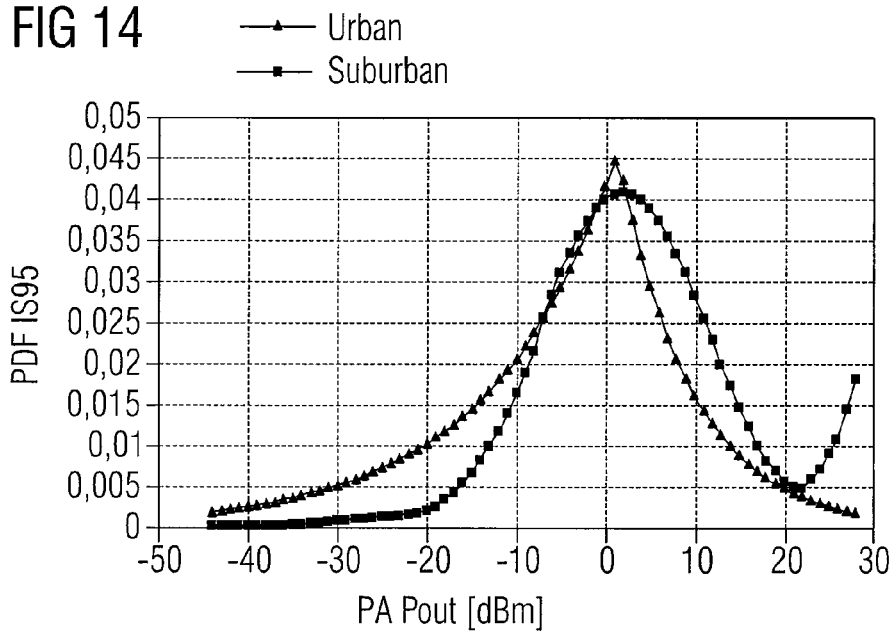
FIG. 14 shows a probability density distribution of the required output power of an IS95/UMTS mobile communication system.
Figure 15:
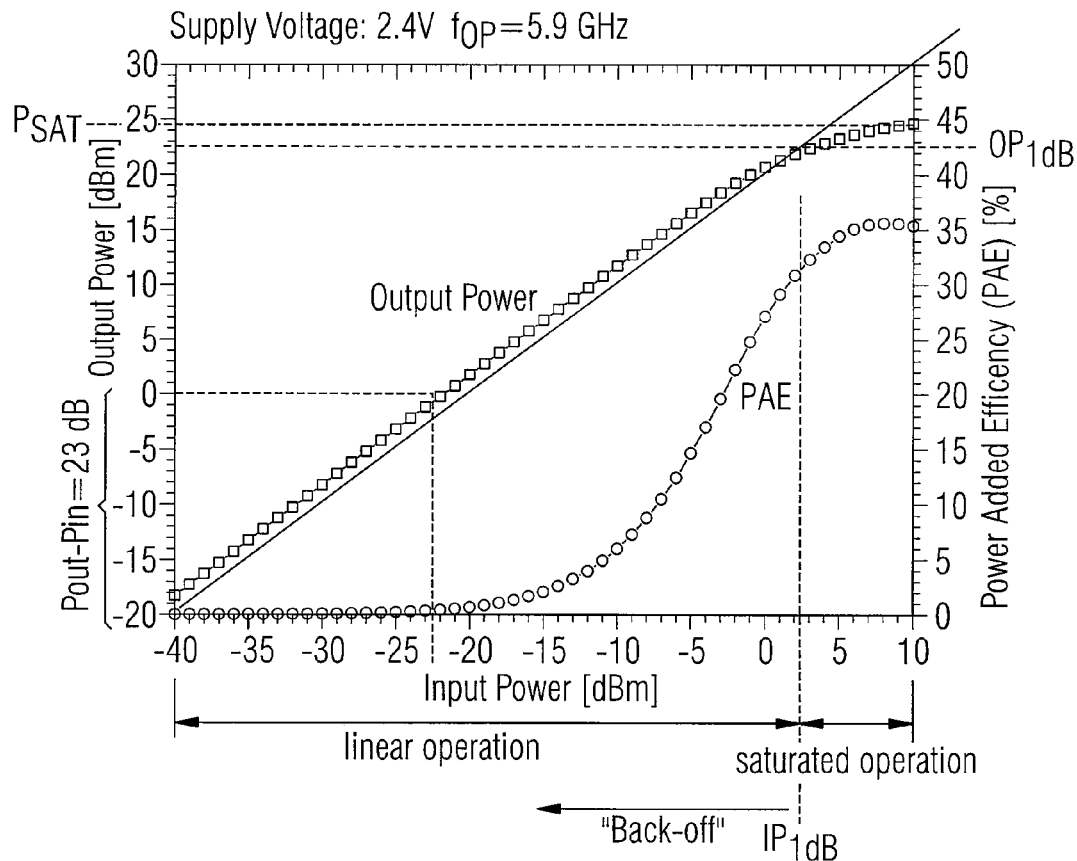
FIG. 15 shows the characteristic of a conventional power amplifier.

The above embodiments employ branch line couplers as 90° hybrid couplers. However, the invention is not restricted thereto. Other couplers such as Lange coupler are also conceivable. In addition to that, hybrid circuits designed by lumped elements could also be used as couplers. Examples of hybrid circuits are shown in FIGS. 12 and 13. The input and output ports of the hybrid circuits are designated as In1, In2, Out1 and Out2, respectively. The input ports are coupled with the first and second amplifiers circuits Amp1 and Amp2, respectively, while the first output port is terminated by a suitable resistor or impedance and the second output port is for instance coupled with an antenna or any other load.

The hybrid circuits may comprise two Pi-elements each comprising an inductor $L_S$ and two capacitors $C_G$ which are connected with ground. The inductors $L_S$ are coupled (illustrated by an arrow in FIG. 12) with a given coupling strength k. In the embodiment shown in FIG. 12 the coupling strength k is about 0.7. The coupling strength k, however, is not restricted to this value. For example, for planar formed inductors coupling strength values between about 0.5 and 0.9 can easily be obtained depending on the actual geometry used. For coiled inductors coupling strength values of up to 0.99 can be obtained. The inductors therefore can have any coupling strength between 0 and 1 (0<k<1) depending on the specific needs. The Pi-elements are also coupled through mutual capacitors $C_M$.

Figure 16:
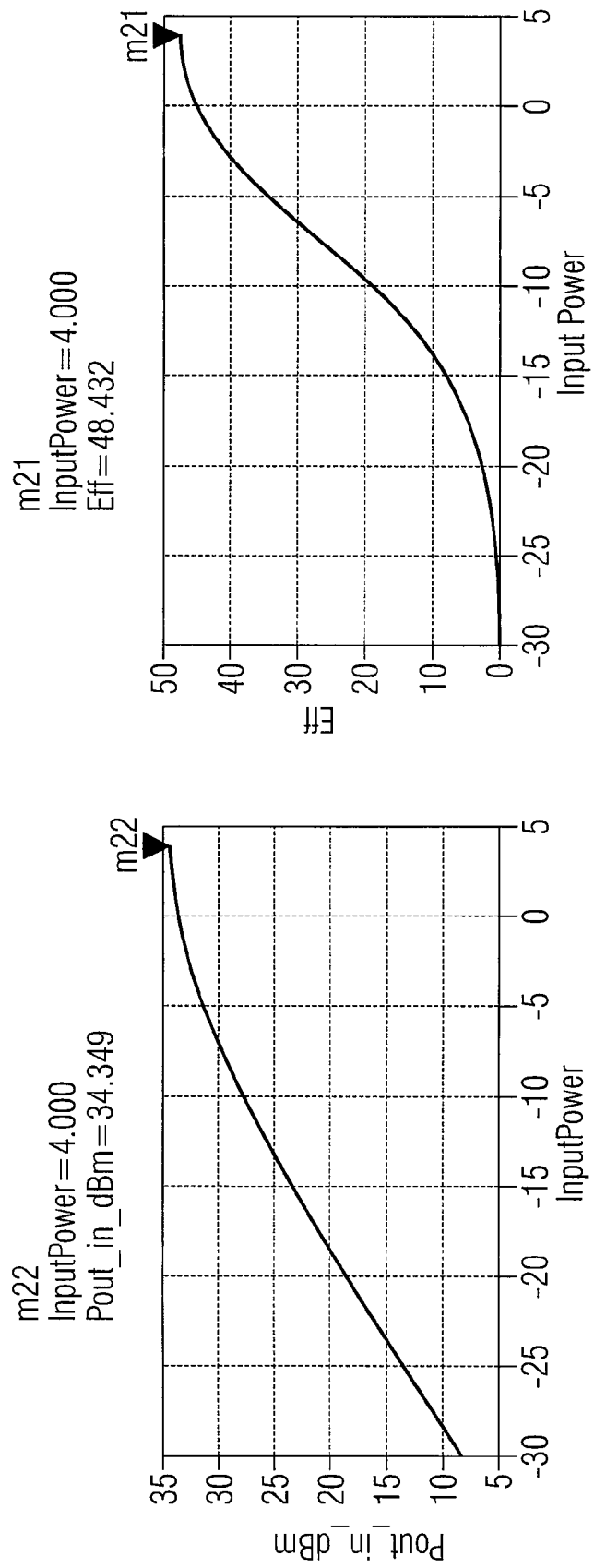
FIG. 16 shows the output power and the efficiency of the balanced power amplifier (FIG. 2) when both amplifier circuits are activated.
Figure 17:
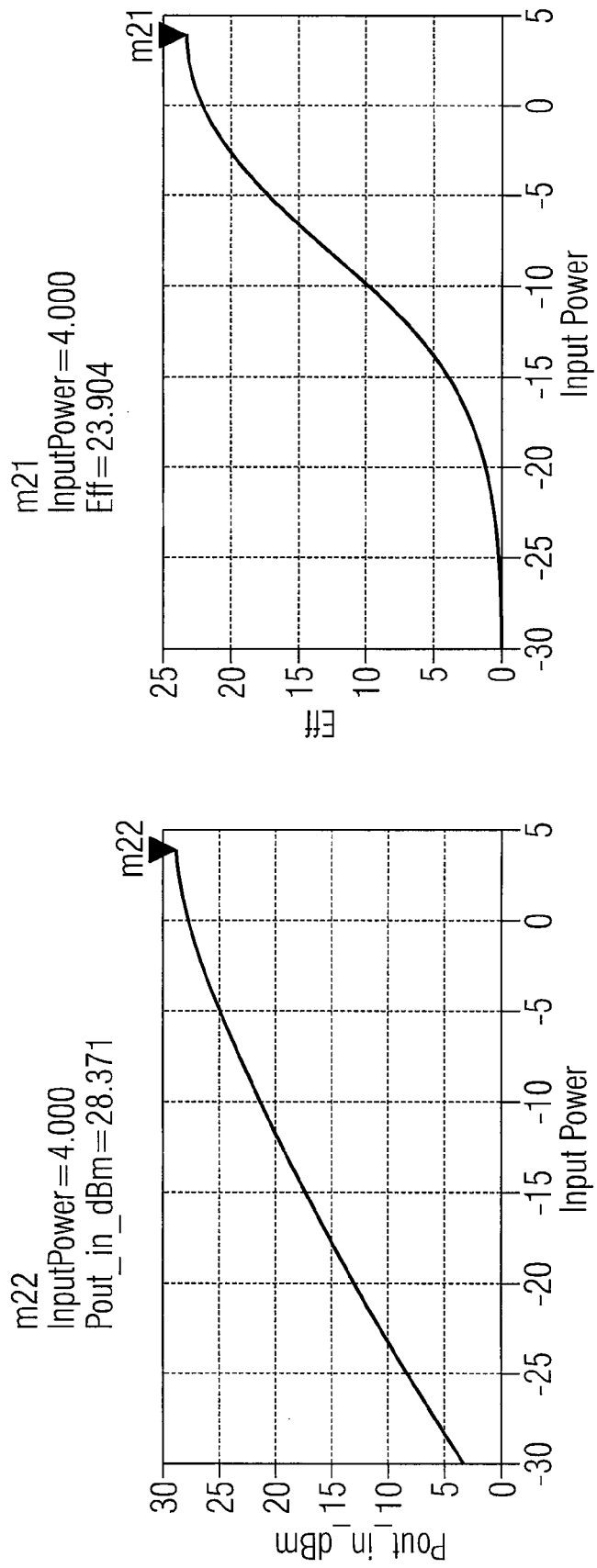
FIG. 17 shows the output power and the efficiency of the balanced power amplifier (FIG. 2) when only one of the amplifier circuits is activated without any impedance matching.
Figure 18:
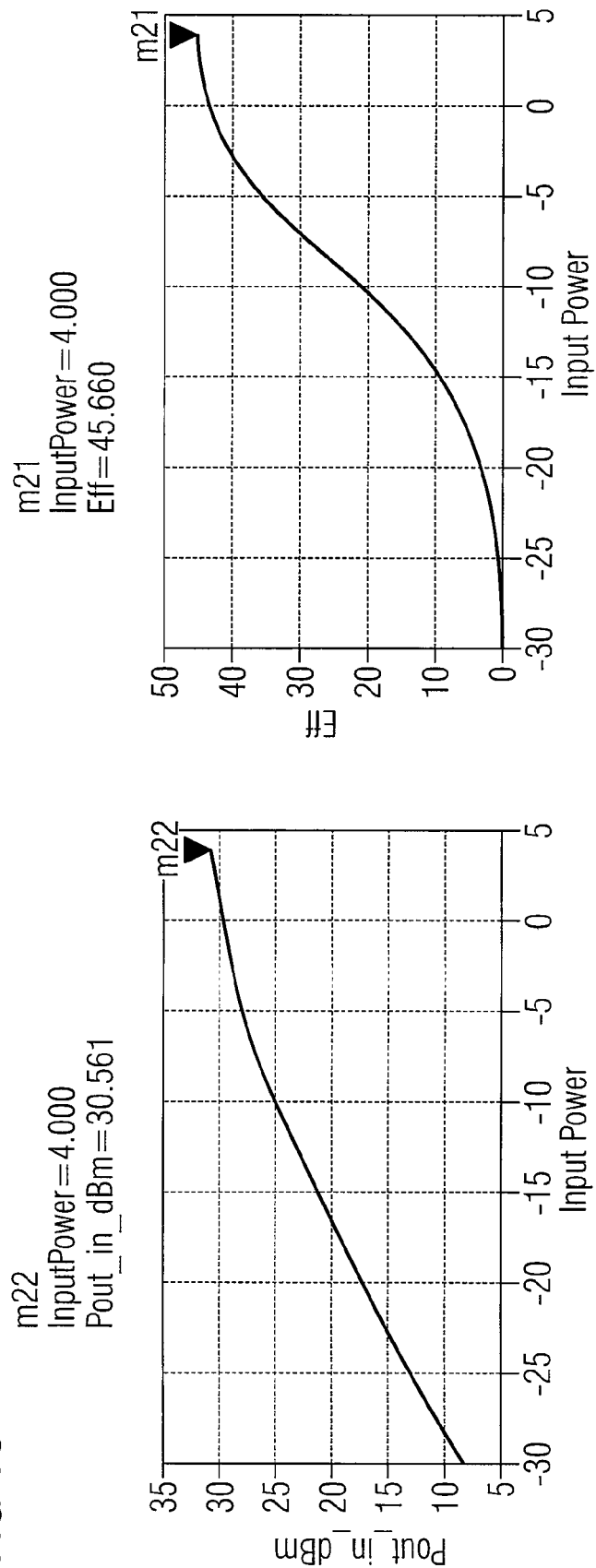
FIG. 18 shows the output power and the efficiency of the balanced power amplifier (FIGS. 3a and 3b) when only one of the amplifier circuits is activated with impedance matching at the couplers.

The effect of the balanced power amplifier as described herein has been simulated, and FIGS. 16 to 18 show the results of this simulation. For the simulation a model of a 1800 MHz GSM power amplifier with a rated output power of 34 dBm output power has been used. FIG. 16 shows the balanced power amplifier when the first and the second amplifier circuits are active. The combined power gain is about 34 dBm with efficiency (PAE) of about 48%. By deactivating one of the two amplifier circuits without any changes made to the termination of the couplers a power gain reduction of about 6 dB would occur with a strong reduction of the PAE down to about 24% as indicated in FIG. 17. To avoid the strong efficiency reduction, an appropriate terminal impedance matching of the balance power amplifier is desired as for instance described in connection with FIGS. 2, 2a and 3a by switching to non-nominal terminal impedances. This results (FIG. 18) in a output power reduction of about 3 dB while maintaining the efficiency of the balanced power amplifier sufficiently high of about 46%.

Figure 19A:
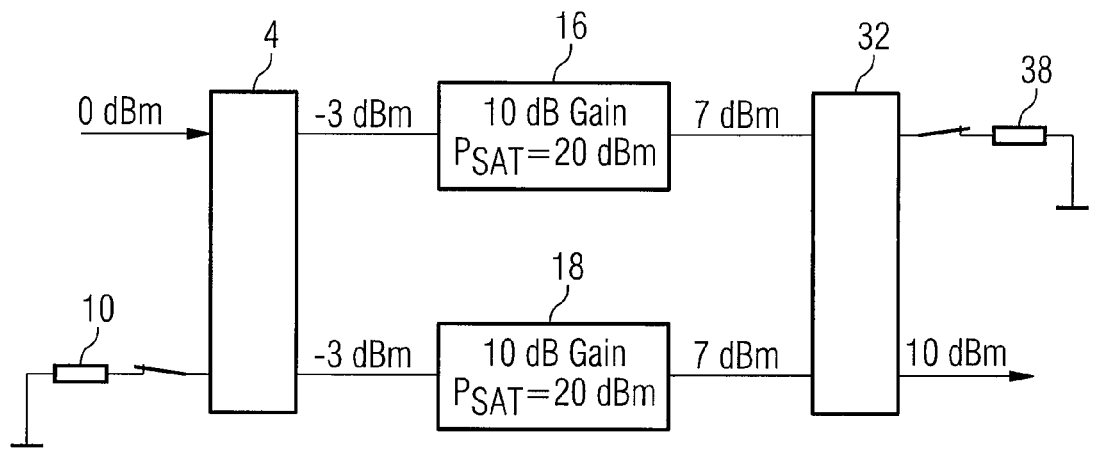
FIGS. 19A and 19B show the small-signal and the large-signal behaviour of a balanced power amplifier.
Figure 19B:
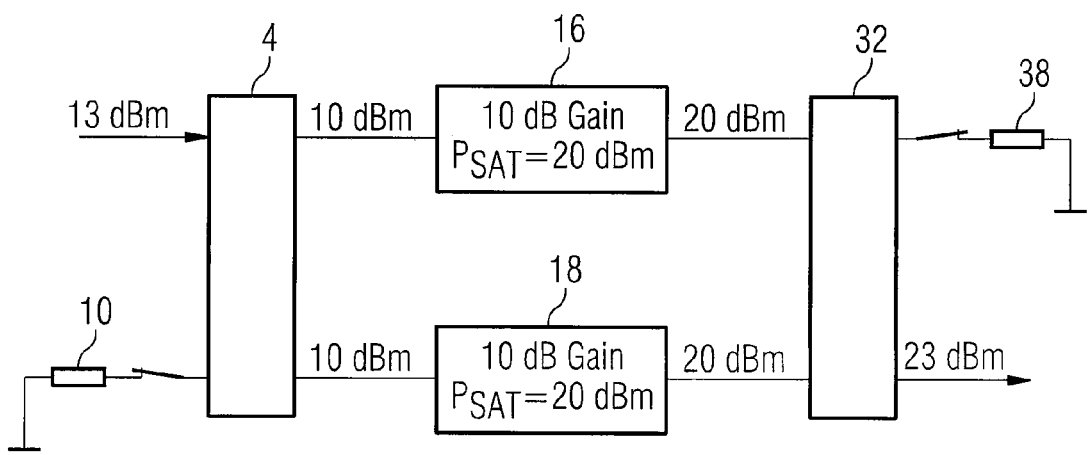
Figure 20A:
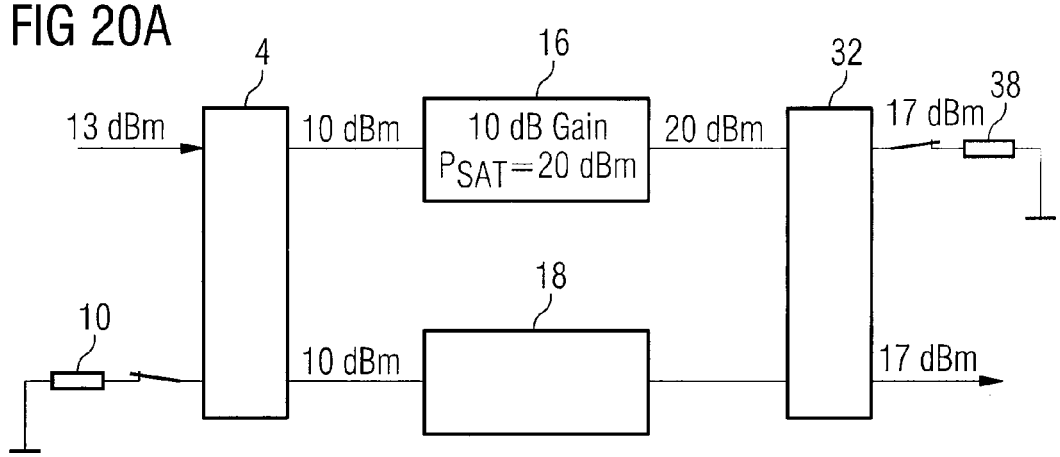
FIGS. 20A, 20B and 20C show the large-signal behaviour of a balanced power amplifier when deactivating any one of its amplifier circuits.
Figure 20B:
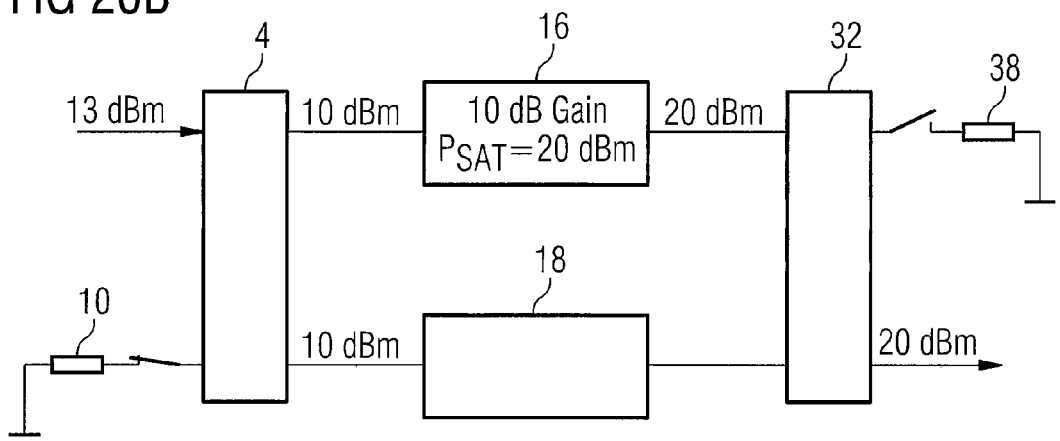
Figure 20C:
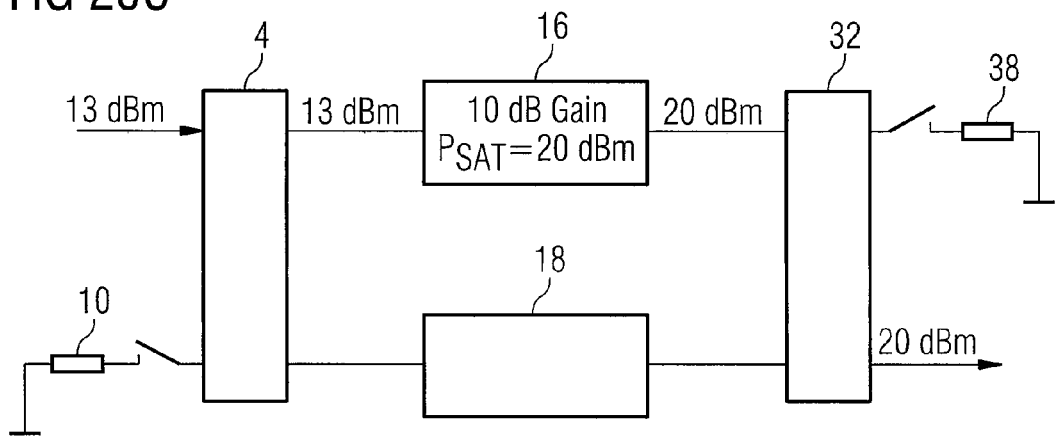

For a better understanding of the impact of the termination impedances reference is made to FIGS. 19 to 20. FIG. 19A illustrates the small-signal behaviour of a balanced power amplifier while FIG. 19B shows the large-signal behaviour of the balanced power amplifier when both amplifier circuits are active, i.e. when the balanced power amplifier operates in high power mode. FIGS. 20A to 20C illustrates the large-signal behaviour when the second power amplifier is deactivated.

Let us assume that a small signal of 0 dBm is applied to the input of the balanced power amplifier, i.e. to the first input port of first coupler 4. The first coupler divides the input signal equally between the first and second output port so that −3 dBm signals are applied to each amplifier circuit 16, 18. Let us assume here that each amplifier circuit has a power amplification (gain) of about 10 dB and a saturated power $P_{SAT}$ of about 20 dBm. The −3 dBm signals are amplified by each amplifier circuit 16, 18 so that both amplifier circuits provide 7 dBm signals which are each coupled into the second coupler 32. Second coupler 32 is terminated with nominal terminal impedance 38 and therefore combines the signals received at its second output port. The output signal of the balanced power amplifier is therefore 10 dBm.

When considering the large-signal behaviour (FIG. 19B) of the balanced power amplifier the saturation power $P_{SAT}$ of the amplifier circuits needs to be taken into account. $P_{SAT}$ is defined to be the maximum output power which an amplifier can provide. Hence, the maximum output power of the balanced power amplifier, i.e. the combined output signals of the amplifier circuits, is 23 dBm. Due to the gain of 10 dB the maximum input signal for each amplifier circuit is 10 dBm. Since the 10 dBm signals amplified by the amplifier circuits are signals equally divided by the first coupler 4, the corresponding maximum input signal of the balanced power amplifier is 13 dBm.

When deactivating the second amplifier circuit 18 without re-matching the impedances at the second input port of the first coupler and at the first output port of the second coupler as illustrated in FIG. 20A, the 13 dBm input signal is still equally divided between both amplifier circuits 16, 18 so that each amplifier circuit 16, 18 receives a 10 dBm signal. However, only the first amplifier circuit 16 amplifies the signal received and couples its amplified signal of about 20 dBm into the second coupler. Since second amplifier circuit does not provide a signal, no signal cancellation occurs at the first output port of the second coupler 32 and hence, about half of the power provided by the first amplifier circuit is consumed by nominal terminal impedance 38. The output power of the balanced power amplifier is therefore reduced down to about 17 dBm.

FIGS. 20B illustrates the case that only the second coupler 32 is appropriately terminated. Second amplifier circuit 18 remains deactivated. When disconnecting the first output port of the second coupler 32 from the nominal terminal impedance, the first output port of the second coupler 32 is open or, which is electrically equivalent, connected with high value non-nominal impedance. In this case the second coupler 32 simply behaves here like a phase-shifting element. Therefore, no power is transmitted from the first amplifier circuit 16 to the terminal impedances 38, and the 20 dBm signal provided by the first amplifier circuit 16 is completely presented to the load.

When re-matching occurs at both couplers 4, 32 as illustrated in FIG. 20C the first coupler 4 does not divide the signal equally between the first and the second amplifier circuit 16, 18. Rather, the input signal of the balanced power amplifier is completely transmitted to the first amplifier circuit 16 only so that the first amplifier circuit 16 receives a higher input signals in comparison to the situation of FIG. 20B.

The same signal behaviour as described above can be observed when the first amplifier circuit 16 is deactivated while keeping the second amplifier circuit 18 active. Hence, when deactivating any one of the amplifier circuits 16 and 18 and appropriately re-matching the impedances, the output power of the balanced power amplifier is reduced by about 3 dB while maintaining high efficiency and the gain of the balanced power amplifier. Since one amplifier circuit is deactivated, the power consumption of the balanced power is reduced which increases the available talk-time of a mobile communication device employing the above described balanced power amplifier.

Having thus described the invention in detail, it should be apparent for a person skilled in the art that various modifications can be made in the present invention without departing from the spirit and scope of the following claims.

What is claimed is:

1. A power amplifier comprising:
    at least a first amplifier circuit comprising an output port;
    at least a second amplifier circuit comprising an output port;
    at least a coupler comprising a first and a second input port and a first and a second output port, the first input port of the coupler being coupled with the output port of the first amplifier circuit and the second input port of the coupler being coupled with the output port of the second amplifier circuit; and
    a switch comprising at least one input terminal and at least two output terminals, the input terminal of the switch being coupled with the first output port of the coupler, each of the output terminals of the switch being connected with a separate terminal impedance, the separate terminal impedances having different impedance values.

2. The power amplifier according to claim 1, wherein one of the separate terminal impedances is a nominal terminal impedance having 50 Ohm and another one of the separate terminal impedances is a non-nominal terminal impedance.

3. The power amplifier according to claim 2, wherein the impedance value of the non-nominal terminal impedance is substantially lower than the impedance value of the nominal terminal impedance.

4. The power amplifier according to claim 3, wherein the impedance value of the non-nominal terminal impedance is less than 5 Ohm.

5. The power amplifier according to claim 2, wherein the impedance value of the non-nominal terminal impedance is substantially higher than the impedance value of the nominal terminal impedance.

6. The power amplifier according to claim 5, wherein the impedance value of the non-nominal terminal impedance is higher than 1 kOhm.

7. The power amplifier according to claim 1, comprising a further coupler comprising a first and second input port and a first and second output port, the first output port of the further coupler being coupled with an input port of the first amplifier circuit, the second output port of the further coupler being coupled with an input port of the second amplifier circuit, the first input port of the further coupler being coupled with an input port of the power amplifier, and the second input port of the further coupler being coupled with a terminal impedance.

8. The power amplifier according to claim 7, comprising a further switch comprising at least an output port and at least a first and a second input port, the output port of the further switch being coupled with the second input port of the further coupler, and each of the input terminals being connected with a separate terminal impedance, the separate terminal impedances having different impedance values.

9. The power amplifier according to claim 8, wherein one of the separate terminal impedances is a nominal terminal impedance having 50 Ohm and another one of the separate terminal impedances is a non-nominal terminal impedance.

10. The power amplifier according to claim 1, further comprising at least an amplifier control switch, the amplifier control switch being coupled with at least with one of the first and second amplifier circuits for selectively activating the respective amplifier circuits.

11. The power amplifier according to claim 1, wherein the coupler is a branch-line coupler.

12. A power amplifier comprising:
    at least a first amplifier circuit comprising an input port;
    at least a second amplifier circuit comprising an input port;
    at least a coupler comprising a first and a second input port and a first and a second output port, the first output port of the coupler being coupled with the input port of the first amplifier circuit, the second output port of the coupler being coupled with the input port of the second amplifier circuit, and the first input port of the coupler being coupled with an input port of the power amplifier; and
    a switch comprising at least one output terminal and at least two input terminals, the output terminal of the switch being coupled with the second input port of the coupler, and each of the input terminals of the switch being connected with a separate terminal impedance, the separate terminal impedances having different impedance values.

13. The power amplifier according to claim 12, wherein one of the separate terminal impedances is a nominal terminal impedance having 50 Ohm and another one of the separate terminal impedances is a non-nominal terminal impedance.

14. The power amplifier according to claim 13, wherein the impedance value of the non-nominal terminal impedance is substantially lower than the impedance value of the nominal terminal impedance.

15. The power amplifier according to claim 14, wherein the impedance value of the non-nominal terminal impedance is less than 5 Ohm.

16. The power amplifier according to claim 13, wherein the impedance value of the non-nominal terminal impedance is substantially higher than the impedance value of the nominal terminal impedance.

17. The power amplifier according to claim 16, wherein the impedance value of the non-nominal terminal impedance is higher than 1 kOhm.

18. The power amplifier according to claim 12, comprising a further coupler comprising a first and second input port and a first and second output port, the first input port of the further coupler being coupled with an output port of the first amplifier circuit, the second input port of the further coupler being coupled with an output port of the second amplifier circuit, the second output port of the further coupler being coupled with an output port of the power amplifier.

19. The power amplifier according to claim 18, comprising a further switch comprising at least one input terminal and at least two output terminals, the input terminal of the further switch being coupled with the first output port of the further coupler, and each of the output terminals of the further switch being connected with a separate terminal impedance, the separate terminal impedances having different impedance values.

20. The power amplifier according to claim 19, wherein one of the separate terminal impedances is a nominal terminal impedance having 50 Ohm and another one of the separate terminal impedances is a non-nominal terminal impedance.

21. The power amplifier according to claim 12, further comprising at least one amplifier control switch coupled with at least one of the first and second amplifier circuits for selectively activating the respective amplifier circuits.

22. The power amplifier according to claim 21, wherein the coupler is a branch-line coupler.

23. A power amplifier comprising:
a first amplifying means for amplifying a signal;
a second amplifying means for amplifying a signal;
a coupling means comprising a first and a second output port, and for combining the signals amplified by the first and second amplifying means at the second output port of the coupling means; and
a switching means coupled to the first output port of the coupling means, and for selectively coupling the first output port of the coupling means with separate terminal impedances.

24. The power amplifier according to claim 23, wherein the first and second amplifier means are selectively operable.

25. A method for operating a power amplifier comprising the steps of:
splitting an input signal to provide at least two split signals;
amplifying each of the split signals by at least two amplifier circuits;
combining the amplified split signals by a coupler at an output port of the coupler, wherein another output port of the coupler is coupled with a nominal terminal impedance; and
reducing the output power of the power amplifier by:
deactivating one of the two amplifier circuits;
disconnecting the nominal terminal impedance from the another output port of the coupler; and
connecting a non-nominal terminal impedance having an impedance value being different from the impedance value of the nominal terminal impedance with the another output port of the coupler.

* * * * *